United States Patent
Den Besten

(10) Patent No.: US 8,422,615 B2
(45) Date of Patent: *Apr. 16, 2013

(54) FAST POWERING-UP OF DATA COMMUNICATION SYSTEM

(75) Inventor: Gerrit W. Den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 517 days.

This patent is subject to a terminal disclaimer.

(21) Appl. No.: 12/528,002

(22) PCT Filed: Feb. 29, 2008

(86) PCT No.: PCT/IB2008/050744
§ 371 (c)(1),
(2), (4) Date: Aug. 20, 2009

(87) PCT Pub. No.: WO2008/107828
PCT Pub. Date: Sep. 12, 2008

(65) Prior Publication Data
US 2010/0067633 A1     Mar. 18, 2010

(30) Foreign Application Priority Data
Mar. 2, 2007   (EP) ..................... 07103450

(51) Int. Cl.
*H04L 7/00*     (2006.01)
*H03L 7/08*     (2006.01)

(52) U.S. Cl.
USPC ............................ 375/356; 375/376; 327/156

(58) Field of Classification Search .......... 375/326–328, 375/344, 354, 356, 360, 362, 373–376; 327/142, 327/147, 148, 151, 156, 157, 160, 163; 713/502, 713/503
See application file for complete search history.

(56) References Cited

U.S. PATENT DOCUMENTS

| | | | |
|---|---|---|---|
| 4,486,739 A | 12/1984 | Franaszek et al. | |
| 5,657,318 A | 8/1997 | Ohmori et al. | |
| 5,726,650 A | 3/1998 | Yeoh et al. | |
| 6,114,890 A | 9/2000 | Okajima et al. | |
| 6,677,824 B2 * | 1/2004 | Harpham | 331/17 |
| 7,486,752 B1 * | 2/2009 | Kwasniewski et al. | 375/354 |
| 2004/0017873 A1 * | 1/2004 | Chong et al. | 375/376 |
| 2004/0100332 A1 | 5/2004 | Miller | |

(Continued)

FOREIGN PATENT DOCUMENTS

| | | |
|---|---|---|
| EP | 0565127 A | 10/1993 |
| EP | 0948134 A | 10/1999 |

(Continued)

OTHER PUBLICATIONS

Den Besten, Gerrit W.; "Embedded Low-Cost 1.2Gb/s Inter-IC Serial Data Link in 0.35 UM CMOS Technology"; IEEE International Solid-State Circuits Conference, Feb. 7, 2000; pp. 251-252; XP010378879.

*Primary Examiner* — Young T. Tse

(57) ABSTRACT

A data communication system has a transmitter with a first clock-generation circuit, and a receiver with a second clock generation circuit. At least a specific one of the clock-generation circuits is powered-down between consecutive data bursts. The system expedites the starting up of operational use of the system upon a power-down of the specific clock-generation circuit. The system presets at a predetermined value an operational quantity of the specific clock-generation circuit at the starting up.

8 Claims, 11 Drawing Sheets

U.S. PATENT DOCUMENTS

| | | |
|---|---|---|
| 2004/0157576 A1* | 8/2004 | Adachi et al. ............... 455/260 |
| 2005/0135523 A1 | 6/2005 | Carballo |
| 2005/0265437 A1 | 12/2005 | Yeung et al. |
| 2006/0045224 A1 | 3/2006 | Cranford, Jr. et al. |
| 2006/0119440 A1* | 6/2006 | Isobe et al. ............... 331/16 |
| 2007/0171114 A1 | 7/2007 | Wu |
| 2007/0182475 A1 | 8/2007 | Shimazaki |
| 2008/0137790 A1* | 6/2008 | Cranford et al. ............ 375/357 |
| 2008/0191760 A1* | 8/2008 | Hao et al. ............... 327/157 |
| 2009/0047029 A1 | 2/2009 | Matsuki et al. |

FOREIGN PATENT DOCUMENTS

| | | |
|---|---|---|
| JP | 2006229671 A | 8/2006 |
| WO | 9641439 A | 12/1996 |
| WO | 0005848 | 3/2000 |
| WO | 2004100000 A1 | 11/2004 |

* cited by examiner

FAST POWERING-UP OF DATA COMMUNICATION SYSTEM

FIELD OF THE INVENTION

The invention relates to a data communication system comprising a transmitter with a first clock-generation circuit, and a receiver with a second clock generation circuit.

BACKGROUND ART

High-speed data communication links usually exploit input-output (IO) signaling techniques that require a significant "static" power consumption part during operation, independent of the actual data rate. In most cases an important part of this power consumption is associated with the need to drive the line termination in order to obtain reliable signaling behavior across a transmission line. A commonly used driver structure is a differential pair, which is resistively loaded. Other line driving solutions, which provide a termination resistance at one end or at both ends, are possible as well. An example of the latter is the full-bridge driver structure with source-series termination and far-end line termination. This lower-power solution can be found, for example, in "Embedded Low-Cost 1.2 Gb/s Inter-IC Serial Data Link in 0.35 μm CMOS technology", G. W. den Besten, Proc. IEEE International Solid-State Circuits Conference, pp 251-252, February 2000 and in some Mobile Industry Processor Interface (MIPI) high-speed interface implementations.

The Mobile Industry Processor Interface (MIPI) Alliance is an open membership organization that includes leading companies in the mobile industry that share the objective of defining and promoting open specifications for interfaces in mobile terminals. MIPI Specifications establish standards for hardware and software interfaces between the processors and peripherals typically found in mobile terminal systems. By defining such standards and encouraging their adoption throughout the industry value chain, the MIPI Alliance intends to reduce fragmentation and improve interoperability among system components, benefiting the entire mobile industry. The MIPI Alliance is intended to complement existing standards bodies such as the Open Mobile Alliance and 3GPP, with a focus on microprocessors, peripherals and software interfaces.

The terminated IO signaling techniques, indicated above, have in common that they consume DC power during operation, independent of the actual transmitted data rate ("Pay-per-Time"). This contrasts with (low-speed) CMOS non-terminated IO technology with rail-to-rail swings that only consumes power during signal transitions ("Pay-per-Signal Transition").

In order to achieve high power-efficiency (Energy/bit), a terminated link should typically be operated at the high-end of the possible transmission speed range allowed by the design. The power consumption of digital circuitry scales with the frequency and the static power consumption per bit will decrease. Therefore, if there is a need for such high-speed IO, there is in many (probably most) cases more bandwidth available than actually needed. This favors burst-mode communication (packets) as it is usually not attractive to run a link at a lower rate, or keep it standby all of the time, especially if the bandwidth requirements are much lower than the available link bandwidth. Between transmission bursts the link can be powered-down to reduce power consumption. However, there is always some overhead time required to start and stop transmission in addition to the time required for the data payload transmission. In order to maintain power efficient operation, even with short data bursts, the start and stop overhead must be as small as possible.

In many cases the detection of the appearance of a data burst in the receiver (RX) is not the main bottleneck. Depending on the stand-by line state, this can, for example, be done with DC line level-detection (MIPI D-PHY), or differential amplitude detection (USB 2.0), periodic polling, activity detection edge detection. [The acronym "D-PHY" is MIPI's name for their serial interface that supports up to four lanes at rates of up to 1 Gbit/sec per lane, based on a 1.2 Volt, source-synchronous scalable low-voltage signaling technology using a nominal swing of 200 mV]. Alternatively, if another mans to communicate exists next to the high-speed (HS) transmission, e.g., slower and/or asynchronous communication via the same link that does not require a lot of stand-by power, a message, command or codeword can be used to identify the start of the data burst. The problem is that, if everything is powered-down, starting up and getting into the "ready-for-transmission/reception-state" (especially the process of locking and synchronizing the clocks) can take a lot of time. The reason for this is that conventional high-speed data communication solutions require that the clocks be stable before (reliable) transmission is possible.

Furthermore, there are two main kinds of clocking solutions for high-speed serial interfaces, referred to as source-synchronous and embedded clock. A big advantage of the source-synchronous solution over the embedded-clock solution is that data and clock (or strobe) signal together contain all necessary information. Frequency may vary over a large range as long as signal integrity is maintained. For conventional embedded-clock solutions the frequency is assumed to be stable during transmission and the data stream itself must include sufficient clock information in order to synchronize the receiver in a reliable way. However, embedded clock solutions can run at higher rates because there is no issue with matching the transmission-path for data and clock/strobe. On the other hand, the embedded clock receiver needs clock and data recovery (CDR), whereas the source-synchronous solution merely requires simple data slicing with the provided clock.

Conventional embedded-clock type solutions can be subdivided in several categories.

A first category relates to the use of a synchronous full-rate or half rate bit clock, or any other lower frequency clock with a fixed and known frequency ratio (e.g., byte or word clock) that is transmitted from the transmitter (TX) to the receiver (RX). It is not kept phase-synchronized with the data. TX and RX share the same clock frequency (or a known and fixed ratio between their clock frequencies), and RX only needs to carry out the phase alignment (and clock multiplication in case a lower frequency fixed-ratio clock is transmitted).

A second category employs a receiver that does not obtain a reference clock signal from the transmitting side, but locks to the embedded clock in the data stream and thus recovers both clock and data information from it. This is possible if the data stream is properly encoded so as to include sufficient clock information. For binary transmission this can, for instance, be achieved with 8B10B codes. A 8B10B code is a line code that maps 8-bit symbols to 10-bit symbols in order to achieve DC-balance and bounded disparity, and yet provide enough state changes so as to allow clock recovery owing to a reduced inter-symbol interference (see, e.g., U.S. Pat. No. 4,486,739). In order to avoid false locking on (sub) harmonics there must be either some locking aid provided, or the data encoding must implicitly provide sufficient frequency information (e.g., Manchester code). For coding efficiency reasons the use of locking aids is preferred in many cases. Locking aids can, for instance, include a local receiver reference clock, which helps to get close to the data rate, and/or a training sequence in the data stream.

A third category has a receiver that does not receive a reference clock signal from the transmitting side, but the transmitter and the receiver each have a local reference clock, whose frequencies are known to be close to one another (e.g., a difference in frequency in the order of a few hundred parts per million), but not exactly equal (i.e., plesiochronous clocks). The receiver clock remains locked to the local reference and data is recovered in the digital domain by oversampling the data stream. Note that, if the receiver clock signal locks on the local reference before data is transmitted, and then synchronizes to the data stream with a training sequence before actual payload data transmission occurs, the local reference clock functions as locking aid and this is covered under the solution of the second category.

The solutions according to the second and third categories require fewer connections than those of the first category (source-synchronous solutions), as these embedded clock solutions do not need a separate clock signal to be transmitted. However, for solutions of the second category the synchronization becomes more complicated because phase synchronization needs to take place and the receiver must first lock on to the proper frequency before reliable data reception is possible. The solutions of the third category can start-up rather fast using the knowledge that the reference frequencies are very close, provided that the clock signals are operational. However, the solutions of the third category conventionally require availability of nearly equal reference frequencies at both ends. This might not be trivial to implement and may require additional reference (probably crystal) oscillators in the system. The solutions of the first category are less attractive than the solutions of the second and third categories, because more connections are needed and because the costs are higher in terms of IO power.

If start-up time is important and the reference frequency is (usually) much lower than the data rate, the clock multiplier in both the transmitter and the receiver must typically be operating and stable before actual data transmission can take place. Practically this means that in many cases clocks will be kept running most of the time because clock-multiplication solutions—for instance a delay-locked loop (DLL) or a phase-locked loop (PLL) is commonly used for this—cannot start-up and become sufficiently accurate fast enough. Keeping these functions awake while operating at high frequencies may consume considerable power.

Consider a conventional communication system, which is to transmit a burst of data starting-up from a fully powered-down state. First, the transmitter clock generation must be started. Transmission can be started when clock frequency and phase have stabilized. The receiver will stay in a powered-down state until it observes a certain indication that a data burst will arrive soon. This can for example be achieved by any of the methods described earlier in this document. A separate sideband signal is undesirable because of additional wires being needed in that case. After detecting some indication of an upcoming data transmission, the receiver clock generation must be started-up and some time is required to obtain a stable frequency and stable phase for the clock signal. In the time between the start of transmission and the moment that reliable reception is possible, a training sequence needs to be transmitted to synchronize the receiver. Although the start-up time of the transmitter and receiver clock generation procedures may be (partially) overlapping, and additional measures can be taken for faster acquisition, the start-up time in conventional systems will remain relatively long because it is practically bounded by at least a clock start-up, stabilization of both frequency and phase, and the synchronization time of a PLL or DLL. Fast power-down after data transmission has completed is typically not a serious problem.

A low reference-frequency, and therefore a high clock-multiplication factor, is desirable for reasons of power and electromagnetic interference (EMI). This results in a slow synchronization process, because clock multiplication loop bandwidth needs to be even significantly lower for stability reasons. For example, for a clock-multiplier PLL with an input reference clock of, say, 10 MHz, a loop bandwidth smaller than 1 MHz is realistic, which will typically result in a phase settle time larger than 10 µs. Lower reference frequencies and/or lower loop bandwidth for enhanced phase filtering properties further increase start-up time. Frequency acquisition time comes on top of this phase synchronization time. This can easily lead to a start-up time in the order of 10-100 µs or even longer. For example, for a 2 Gb/s data transmission, 100 µs is equivalent to 200,000 bits, which implies that transmission of short data burst becomes highly inefficient ("Pay-per-Time"). Higher reference frequencies can reduce start-up time, but not by orders of magnitude without running into severe problems on power and EMI issues.

The start-up duration problems are strongly correlated with the fact that conventional communication systems implicitly assume an underlying accurate absolute time-base for both transmitter and receiver. Although this results in a system which is easy to understand it is not efficient.

SUMMARY OF THE INVENTION

An aspect of the invention here proposed resides in an embedded-clock data communication concept, which does not rely on stable frequency clock signals, but instead allows for varying and settling clock signals while data transmission is already taking place. The invention enables fast start-up from a completely powered-down state, by allowing slowly varying clock frequencies, thereby eliminating the need to have the high-speed clock multiplication/generation being operational long before start-up or the need for a long training period, as in conventional solutions discussed above. Another aspect of the invention resides in providing measures to speed-up the locking of the clock-generation circuits in transmitter and/or receiver to the desired frequency.

More specifically, the inventor proposes a data communication system comprising a transmitter with a first clock-generation circuit, and a receiver with a second clock generation circuit. At least a specific one of the first and second clock-generation circuits is powered-down between consecutive data bursts in the communication. The system has means operative to expedite starting up operational use of the data communication system upon a power-down of the specific clock-generation circuit. The means comprises preset means for presetting at a predetermined value an operational quantity of the specific clock-generation circuit at the starting up.

The operational quantity can be an analog quantity. Preferably, then, the specific clock-generation circuit comprises a frequency acquisition aid. The operational quantity can also be a digital quantity. If the frequency of the specific clock-generation circuit can be set by loading a digital word into a register, a frequency acquisition aid is not needed. Frequency acquisition aids are known in the art. An embodiment of such an aid compares the clock signal to be controlled with a reference clock and creates a control signal representative of the difference between the frequencies. Frequency acquisition aids are typically used to drive a PLL to the desired frequency if the PLL has an extremely narrow frequency bandwidth wherein it can stabilize. The inventor now proposes to use this aid at start-up after a power-down of the clock-generation circuit, especially in the clock-generation circuit of the receiver.

In an embodiment of the invention, the preset means is operative to use a previous value of the operational quantity stored during a previous one of the data bursts, as the predetermined value for use in the communication of a next one of the data bursts. In burst-mode data communication, the system typically operates on similar bit rates for consecutive data bursts. Therefore, the clock generator state of the previous burst can be considered an accurate preset value for the next burst to enhance start-up time significantly.

In an interesting embodiment of the invention, the transmitter is configured to begin communicating the data to the receiver before an attribute of a clock signal in the first clock-generation circuit has settled, and the receiver is configured to track the data received while the attribute is settling. The attribute is, e.g., a clock frequency or a clock phase. If the clock frequency or the phase of the clock signal of the transmitter has not stabilized yet, but is within a certain range or has an otherwise predictable and/or traceable behavior, the receiver can take this into account while recovering the data received. Such a receiver can be an asynchronous receiver solution as described in non-pre-published European patent application no. 06125048.6 filed Nov. 29, 2006 for the same Applicant, or a synchronous receiver that can track the phase-frequency variation accurately enough.

Preferably, the system has an operational mode for the communication of the data in the operational use of the system, and a configuration mode for configuring the system for the operational use. In the configuration mode, a specific one of the transmitter and the receiver communicates to the other one of the transmitter and the receiver information about the attribute, e.g., required training time, frequency behavior and/or phase behavior (for example, during settling), nominal bit rate. As to the attribute "nominal bit rate", this can be used as an indicator for the first-order approximation, as zero is a poor starting position. This becomes even more important if the same interface supports multiple bit rates, such as a base bit rate, 2× the base bit rate, 4× the base bit rate, or any other predetermined rates). In this manner, information about the capabilities of transmitter and receiver can be exchanged so that the system as a whole can operate at a maximum of the performance that it is capable of supporting. The system then may configure the other one of the transmitter and receiver so as to enable the data communication before the attribute has settled. Accordingly, the transmitter and receiver can negotiate their capabilities so as to minimize communication delays and power consumption.

BRIEF DESCRIPTION OF THE DRAWING

The invention is explained in further detail, by way of example and with reference to the accompanying drawing, wherein.

Throughout the Figures, similar or corresponding features are indicated by same reference numerals.

DETAILED EMBODIMENTS

As explained in the background art section above, frequency stabilization and phase stabilization of the clock generation and multiplication modules form the basic limiting factor with respect to fast start-up in conventional systems. Furthermore tight reference-clock constraints of conventional communication solutions can be a significant burden at system level. The invention provides a solution to overcome these limitations and enables fast start-up from power-down.

Figure 1:
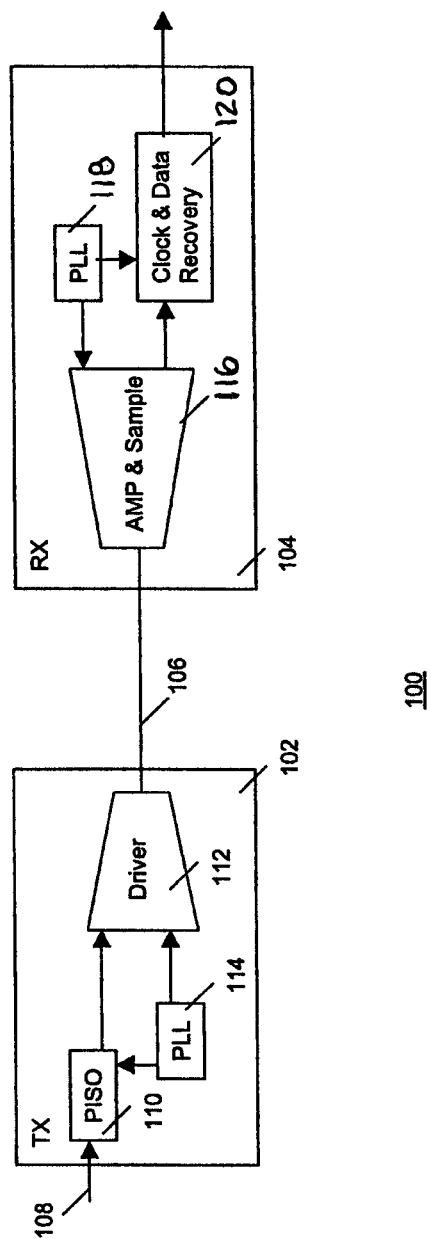
FIG. 1 is a block diagram of a system in the invention.

FIG. 1 is a block diagram of a transmission system 100 in the invention showing basic functionalities. System 100 comprises a transmitter 102, a receiver 104 and a communication channel 106 connecting them. Channel 106 transports a data signal with embedded-clock information. Channel 106 can be, e.g., an electrical or optical connection, single-ended or differential. Transmitter 102 comprises a parallel data input 108 that is connected to a parallel-in/serial-out module 110. Module 110 supplies serial data to a line driver 112 under control of a clock generation circuit with a PLL 114. Transmitter 102 may also comprise a data encoding module (not shown). Receiver 104 comprises an amplifier and sample section 116, a clock generation circuit with a PLL 118, and a clock and data recovery module 120. Receiver 104 may also comprise a burst-detector (not shown) for detecting a data-burst on channel 106.

Figure 2:
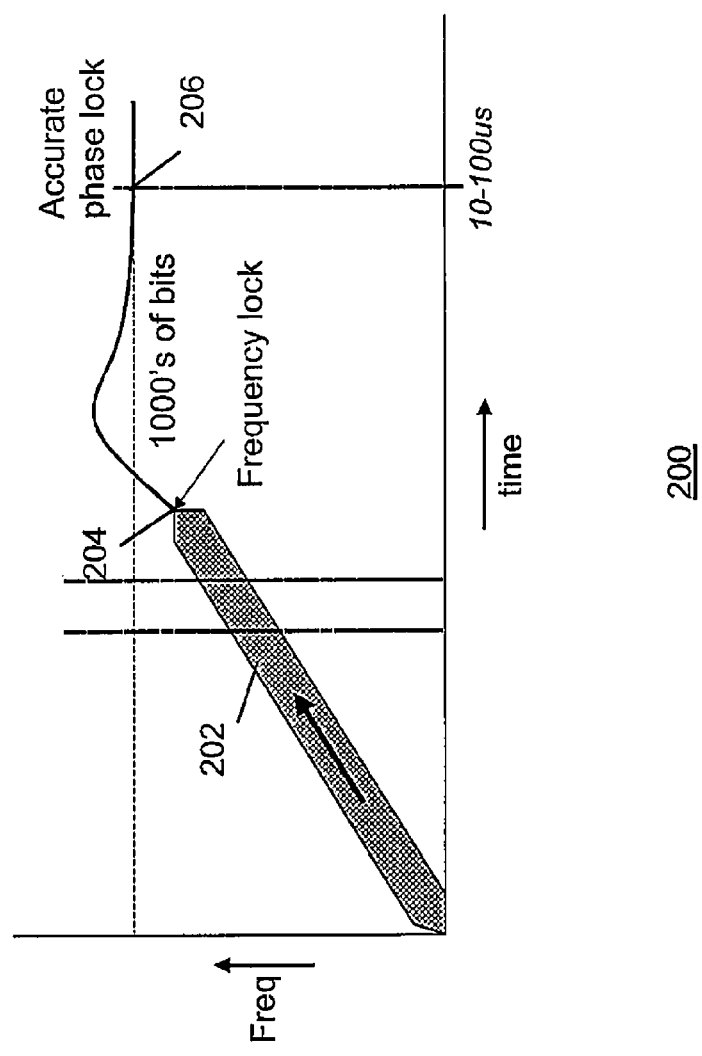
FIGS. 2, 3, 4 and 5 are diagrams illustrating the start-up behavior of a PLL in a system of the invention.

FIG. 2 is a diagram 200 of the behavior of a conventional, second-order PLL at start-up in terms of the frequency attained versus the time elapsed since start-up. Cross-dashed area 202 represents the frequency-search period, wherein the PLL attempts to lock on to the desired frequency. The behavior in area 202 usually shows a lot of spikes due to cycle slips. When the correct frequency is approached at point 204, cycle slips have ceased to occur and the loop settles smoothly towards the correct phase. If the loop is more than critically damped, ringing will not occur. The total start-up time including accurate phase settling at point 206 can take a very long time compared to the bit period. The time between the frequency lock at point 204 and the phase settling at point 206 has a length of many thousands of bit periods.

Figure 3:
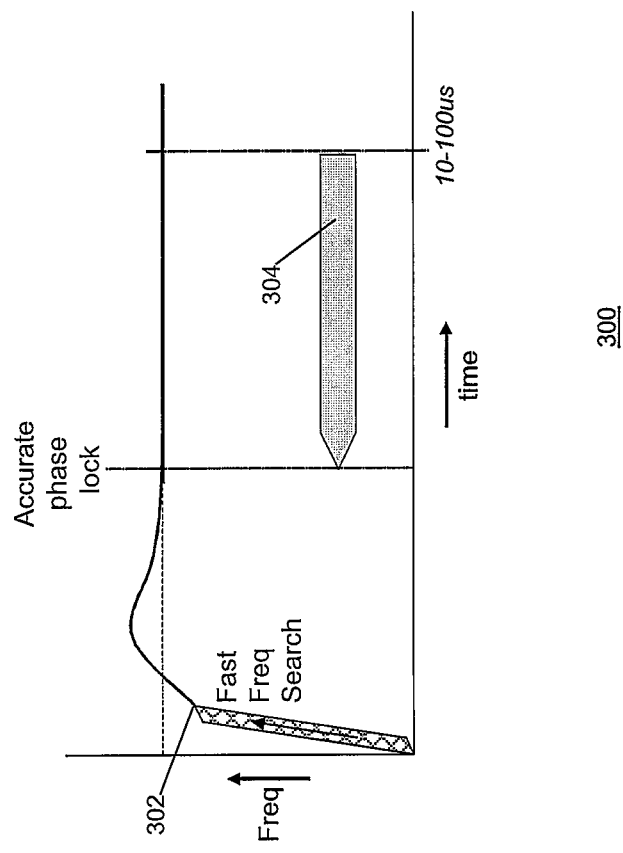

FIG. 3 is a diagram 300 of the behavior of a PLL at start-up, wherein the PLL has been equipped with a frequency acquisition aid to actively drive the PLL's frequency towards the correct frequency during start-up. Diagram 300 shows a similar behavior as diagram 200 for the conventional PLL, but in the former an additional frequency search aid is applied such that the loop becomes much earlier frequency-locked. That is, point 302 of the frequency locking occurs at an earlier time than the locking at point 204. A significant time improvement, indicated by an arrow 304, has been obtained.

Figure 4:
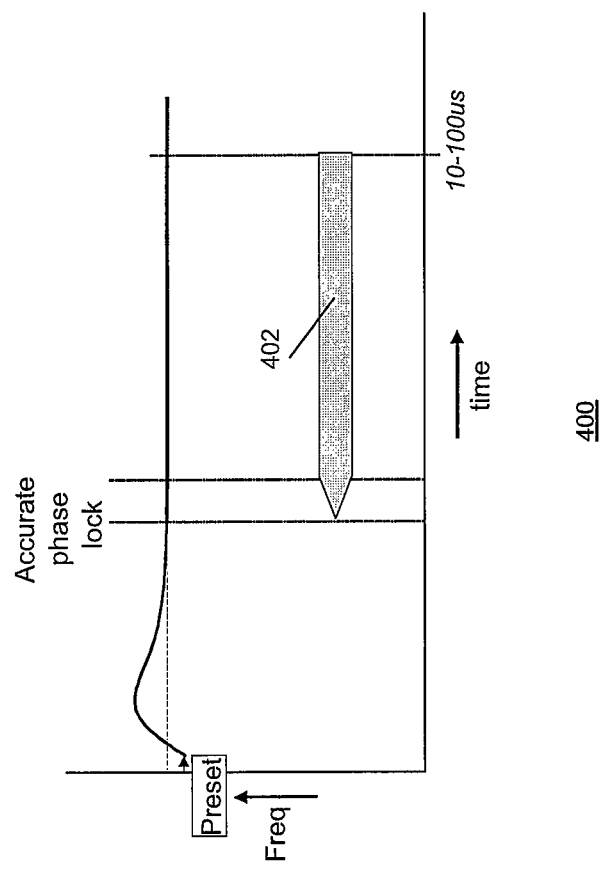

FIG. 4 is a diagram 400 of the behavior of a PLL using a frequency acquisition aid, as in diagram 300, and a preset in addition. Diagram 400 shows that by presetting the loop, some more time gain can be achieved. The accumulated time gained is indicated by an arrow 402. Furthermore, during settling the frequency may stay within tighter limits. A main bottleneck to achieve a very short start-up time is still the accurate phase settling. In order to shorten start-up time, the frequency of the clock generation must become as soon as possible close enough to the nominal frequency (acquisition time $T_{ACQ}$) such that after that moment $T_{ACQ}$, the frequency varies relatively slowly and the frequency value does not exceed certain minimum and maximum limits around the nominal value. The following measures can be taken to achieve this.

A first measure is that the start-up conditions of the clock generation and/or multiplication units are preset, thereby setting an initial start-up frequency. This can for instance be achieved by presetting the state storage element(s) (e.g., capacitor voltages, inductor currents, bias voltages, current source values, and/or digital register states). A second measure relates to burst-mode data communication, wherein the system will typically operate on similar bit rates for consecutive data bursts. Therefore, the clock generator state of the previous burst can be considered an accurate preset value for the next burst to enhance start-up time significantly. A third measure is that, if desirable, presets for multiple different data rates can be stored. If the data rate of the next burst is somehow communicated to the receiver in advance, for example inside the previous burst or with some other kind of line signaling, the receiver can use to appropriate preset values to start at (almost) the right frequency. A fourth measure is based on the fact that, if the preset-values versus frequency relationship are known by the system, the required preset value can also be programmed straightaway for any frequency. If none of the previous measures is possible, which may occur for instance during the very first start-up after a system reset, a fast acquisition aid can be applied to bring the frequency close to the nominal frequency. Note that in case the clock-generation circuit is a fully digital electronic circuit, a frequency acquisition aid is not needed if the value of the desired frequency is known in advance and can be loaded in a register by way of a digital preset, so as to have the clock-generation circuit operate at the desired frequency right from the start.

Figure 5:
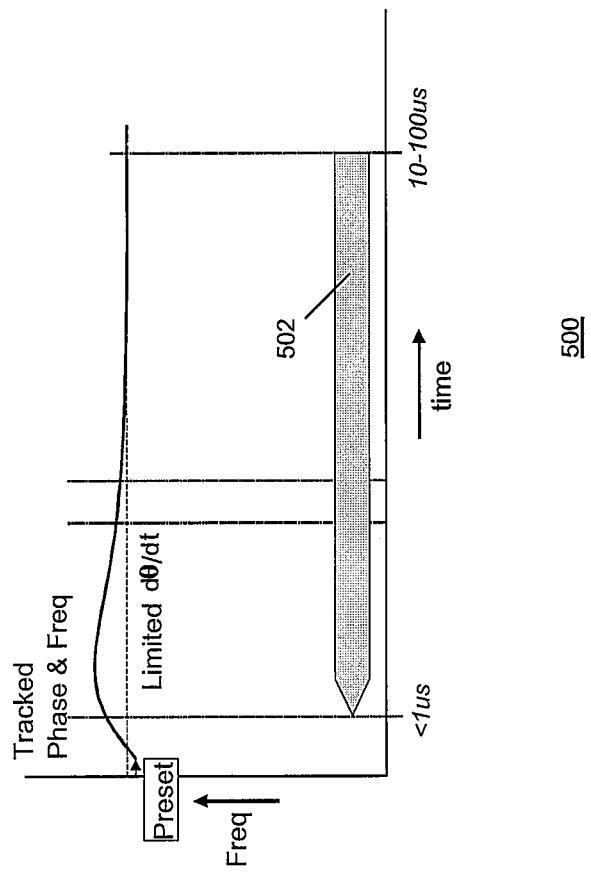

FIG. 5 is a diagram 500 of a PLL that uses a frequency acquisition aid and presetting, as discussed under FIG. 4, and that in addition is operational after a very short start-up time if it is known to the system that it is not necessary anymore to wait for accurate phase settling. For example, transmitter 102 knows that receiver 104 is capable of tracking the data as received even if the phase has not settled yet at transmitter 102. That is, the change per unit time in the phase $\theta$, denoted as $d\theta/dt$, is small enough or is predictable enough for the receiver to track it and to recover the data upon receipt. It might even be advantageous to further slow down the actual phase settling in order to make the analog loop behave smoothly and the phase tracking in the digital data recovery easier. The conventional trade-off between settling time and smooth and stable behavior has been decoupled such that these can be optimized simultaneously. Arrow 502 indicates the time gained, relative to the scenario of FIG. 2, using the combination of frequency acquisition aid, preset and phase tracking before the phase has settled.

Figure 6:
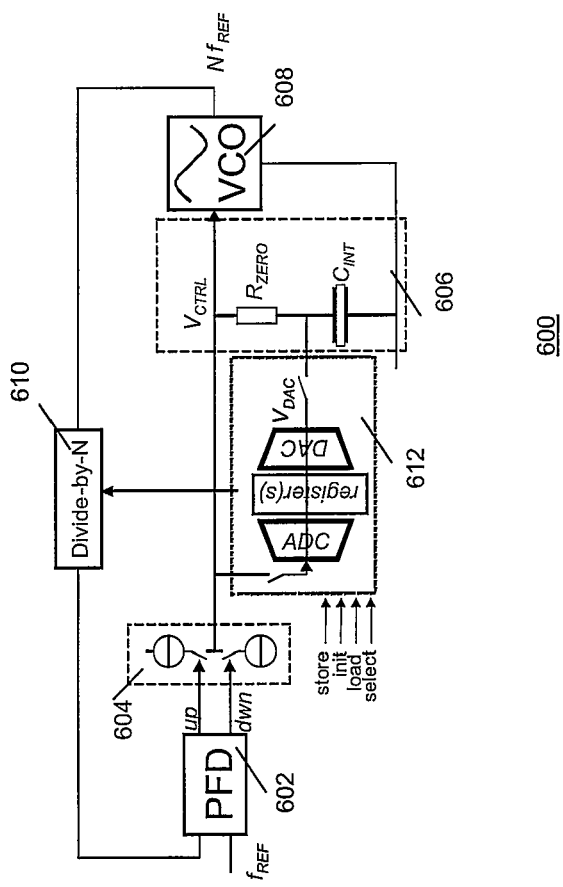
FIGS. 6 and 7 are block diagrams of PLL circuits having preset facilities.

FIG. 6 is a block diagram of a PLL clock multiplier function circuit 600 for use in transmitter 102 and/or receiver 104. Circuit 600 includes the frequency preset as discussed under FIG. 4. Circuit 600 has a phase-frequency detector 602, a charge pump 604, a low-pass filter 606, a voltage-controlled oscillator (VCO) 608 and a divider 610. Components 602-610 form a conventional PLL. According to the invention, circuit 600 comprises a preset block 612 that stores in digital format the analog values of one or more voltages that occur at strategic nodes in circuit 600. The values are stored as representative of the state wherein the PLL has locked on and has settled. Block 612 comprises an analog-to-digital converter (ADC), one or more registers, and a digital-to-analog converter (DAC). The values stored have been loaded or captured during a previous data transmission. Alternatively, system 100 comprises a controller (not shown) for control of preset block 612, wherein the controller determines what values to store based on predetermined information about the upcoming transmission. Upon a restart, preset block 612 charges the relevant capacitors so as to have them assume the voltages corresponding with the stored values, thus expediting the settling.

Figure 7:
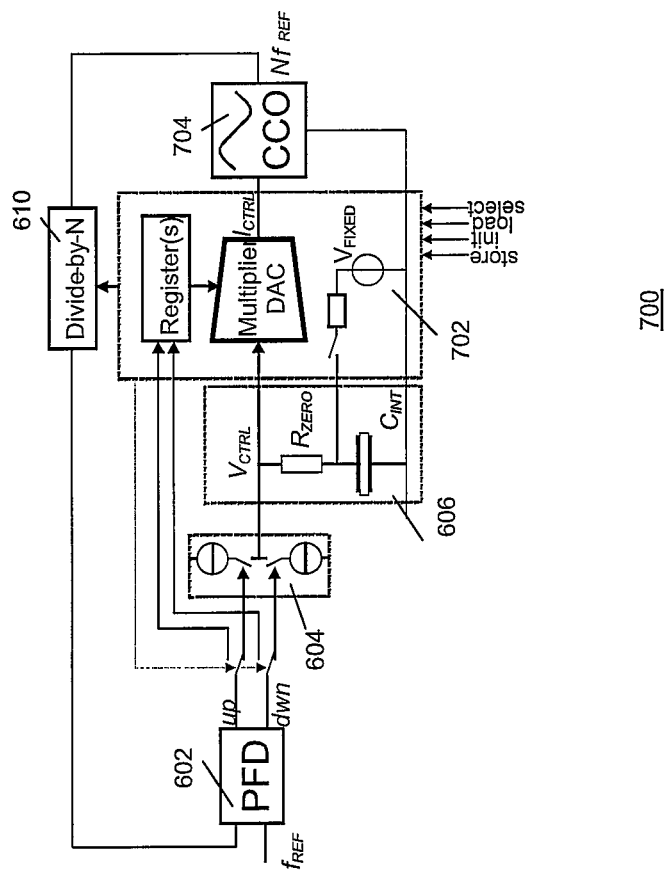

FIG. 7 is a block diagram of another PLL clock multiplier function circuit 700 for use in transmitter 102 and/or receiver 104. Circuit 700 comprises preset block 702, and a current-controlled oscillator (CCO) 704 instead of a VCO. Preset block 702 comprises a multiplying current-DAC and fixed initial control voltage source. This loop can be digitally coarse-tuned if a DAC preset value is not available. Fine-tuning is accomplished via the analog feedback loop via the control voltage. A benefit of the configuration of circuit 700 is that it also ensures a proper analog bias level for the control voltage that is, in first order, independent of device parameter spread. Both PLL examples 600 and 700 have the advantage that the preset value is stored digitally. Although analog state storage might be possible, leakage does not make it easy to store an accurate analog value for a long time.

Receiver 104 has preferably a fast-locking operation with sufficient tracking bandwidth in order to track the relatively slow variations in frequency and phase, which appear after the initial acquisition time. This renders obsolete the requirement for a highly stable time-base before reliable data reception becomes possible. It is possible to use an analog phase-synchronized receiver (for clock and data recovery CDR) with sufficient tracking-bandwidth and the start-up enhancements mentioned above. However, it is preferable to use a fast-locking receiver where the clock generation and phase/frequency tracking functions are separated. This can be realized if, for example, the receiver is configured as an over-sampled front-end with digital data recovery allowing asynchronous frequencies. The term "asynchronous" means here that the incoming data rate and generated clocks in receiver 104 can have any fractional ratio, so not just integer or close to an integer ratio.

Figure 8:
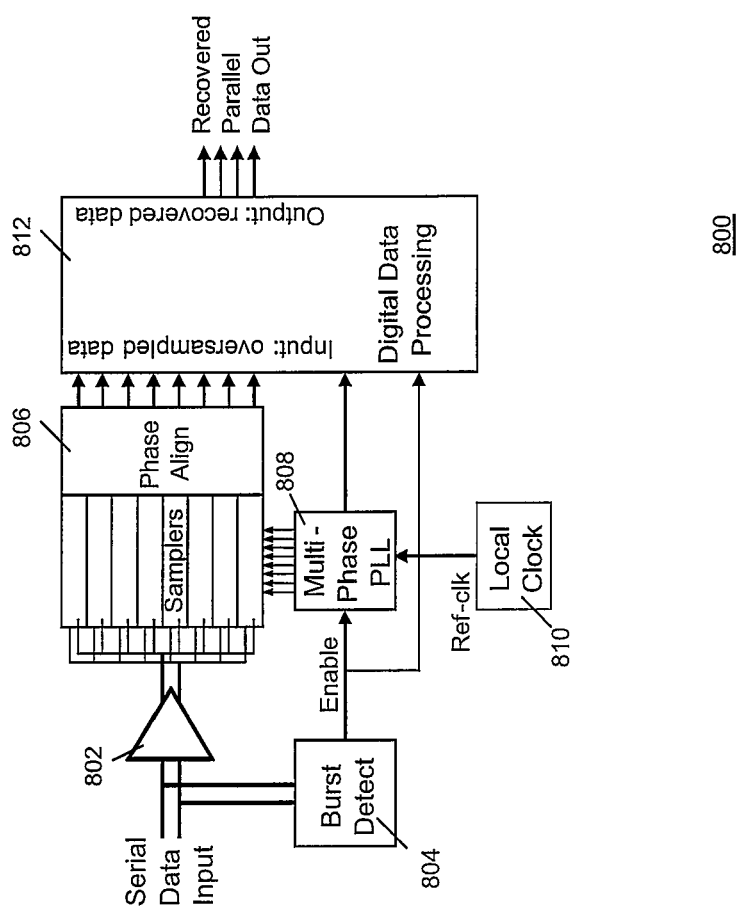
FIG. 8 is a block diagram of an asynchronous receiver.

In this case, both the (analog) transmit and receive clock generation PLLs (and/or DLLs) can be provided with the start-up enhancements as described above. The digital data recovery tracks the aggregate of slow frequency (and phase) changes from the clock generation modules in transmitter 102 and receiver 104, which occur during settling, spread spectrum clocking, or otherwise. An interesting advantage of this approach is that the (analog/mixed-signal) frequency generation behavior has been largely decoupled from the (digital) phase tracking. The digital tracking can be realized much faster. The clock generation/multiplication has to be relatively slow due to loop stability and the requirement for smoothly filtered phase transfer characteristics. FIG. 8 is a block diagram of an example of an asynchronous receiver 800.

Receiver 800 comprises an optional pre-amplifier 802, a burst detector 804, a sampling and phase alignment module 806, a multi-phase PLL 808, a local clock 810 and a data processor 812. Amplifier 802 and burst detector 804 are connected to the serial input of receiver 800. Upon detecting a data burst, detector 804 enables PLL 808 that receives a reference clock signal from local clock 810. Amplifier 802 amplifies the data before the data are sampled and get their phases aligned under control of PLL 808. The data are oversampled at module 806 and supplied to processor 812 for recovery. The output of processor 812 supplies the recovered data in parallel.

Another important advantage of the communication link in the invention is that independent reference clock frequencies can be used at both ends (transmitter and receiver). The frequencies do not need to have high absolute accuracy as long as the frequency varies only slowly. This allow: using local clock reference devices of a quality lower than that of crystal oscillators; using the clock generation/multiplication for both transmitter and receiver in case of a dual-simplex link configuration, because there is no need anymore for data-clock synchronization for the receiver function; receiving multiple different bit rates using the same receiver running at a certain clock frequency as long as the digital data recovery is capable of covering the range.

The scenario of a fast start-up from power-down of the communication is for example the following. First, transmitter 102 and receiver 104 are in power-down. The transmitter clock generation and the receiver clock generation have powered down and the IOs are in a low-power state. Then, system 100 at the transmitter side issues a transmit request to the transmitter side. Transmitter 102 starts-up its clock generation, powers-up the IO, and signals to receiver 104 that a burst will follow soon, so that receiver 104 can also power-up its clock generation. Receiver 104 responds by waking up, and activates the necessary IO functions, and starts-up its clock generation. Alternatively, in certain system configurations, receiver 104 and transmitter 102 might know in advance when to wake-up and their clock generation can be powered-up using that information (probably simultaneously). After acquisition, transmitter 102 starts to transmit a training sequence for a certain time period in order to enable receiver 104 to lock. Especially for an asynchronous receiver this time period can be short compared to conventional analog PLL phase synchronization periods. Properties of receiver 104 can be communicated to and stored in transmitter 102, or programmed in transmitter 102 to accommodate for the best length of the training sequence. After this, encoded data is transmitted across link 106. This coding can for example use 8b10b. Begin and end of valid data in the burst can be indicated by appropriate exception code words. At the end of the transmission a preset value can be stored (if available), see above. After the end of transmission, both transmitter 102 and receiver 104 can be powered down, by stopping the clock generation and putting the IO back in a low-power state.

If the reference clock frequency for the clock multiplication unit is low, it is possible to perform the clock multiplication in two steps in order to speed up the overall start-up time. The first PLL then multiplies the reference frequency so as to achieve a certain intermediate frequency, and the second PLL multiplies the intermediate frequency to create the desired frequency. As an option, one could keep the first PLL operational all the time because it consumes less power than the second PLL, owing to the lower clock rates in the former. Alternatively, the control loop of the first PLL can be configured so as to be as fast as possible. This, however, gives rise to a rather nervous phase behavior (just stable) at the output. The second PLL then receives a much higher input frequency. This implies that the second PLL can filter the input phase variations heavily without really increasing the overall settle time, so long as the absolute loop bandwidth of the second PLL is larger than that of the first PLL. In this manner, the loop of the second PLL smoothes the overall phase behavior of the two cascaded PLL-driven clock multiplications. These smooth variations now have to be tracked by the receiver. For large multiplication factors, this principle can be extended to three of more PLLs in cascade. Accordingly, each clock-multiplication unit may consist of one or more PLLs. This subdivision of clock-multiplication can be advantageous for synchronous, asynchronous and plesiochronous receiver architectures.

If the start-up time of the data communication method discussed above is fully optimized and there is still some start-up time left over, there is a manner to make the start-up time (as observed at higher level) even shorter. This manner uses an additional method to transmit data, via the same wires or link available, which does not rely on the high-speed multiplication. It may be advantageous to exploit this additional communication method for training the high-speed mode, while there is already data transmitted with the additional method.

Figure 9:
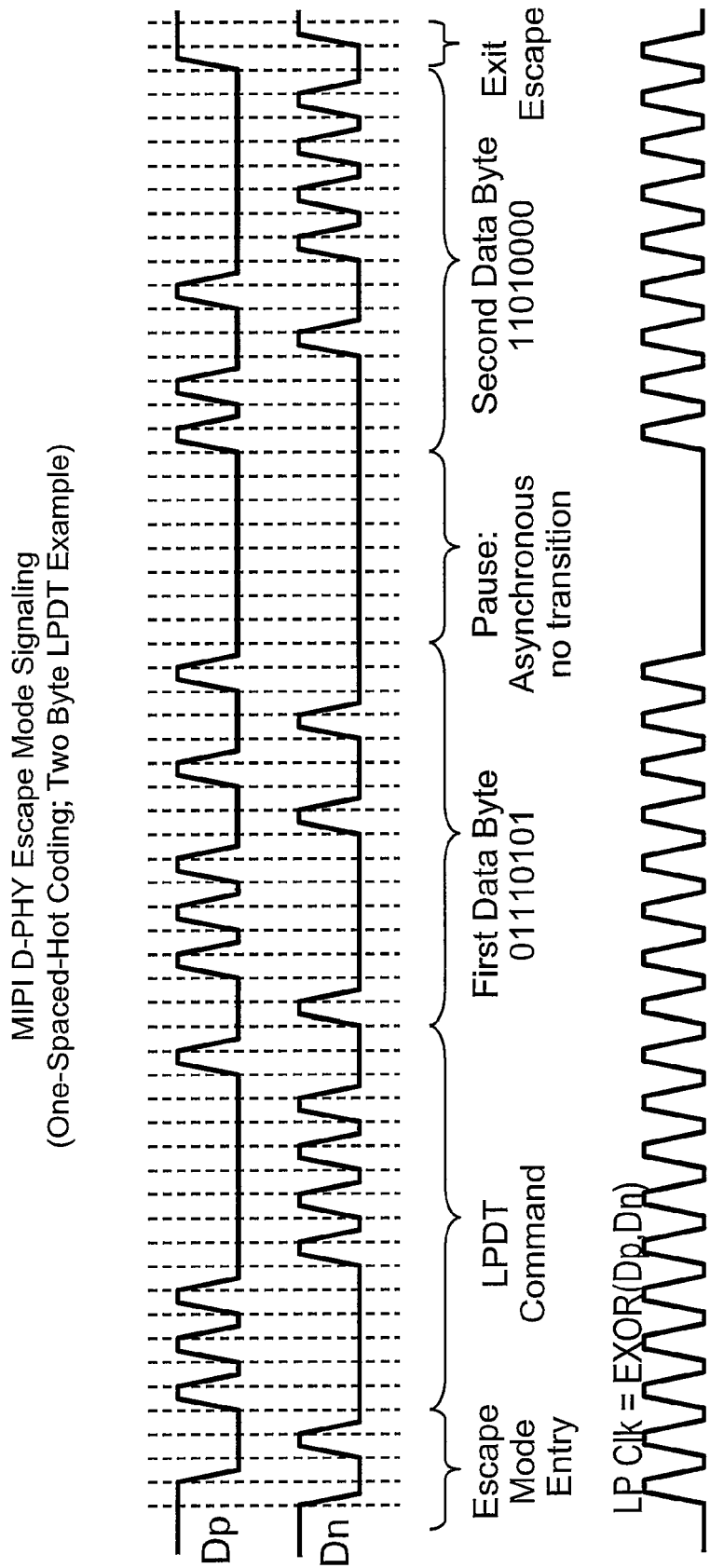
FIG. 9 is a diagram of a MIPI D-PHY escape mode signaling.

In the best case scenario, this approach allows data communication with the additional method to take place, up to the moment that the first-mentioned communication method is ready for transporting data, and then switch over from one signaling method to the other in a smooth manner, i.e., without glitches or gaps. This would squeeze the maximum performance out of the link, as the leading learning time (in case of only using the first-mentioned method) would otherwise be lost. This additional method is preferably a way of communication that becomes instantaneously operational from power-down, without locking, such as, for example, asynchronous communication using data-strobe or one-spaced-hot encoding. The one-spaced-hot encoding uses a "zeroes" signal and a "ones" signal. The signal that shows a pulse determines the polarity. Pulses are separated by a space period in order to avoid overlap of pulses and edges. Please see FIG. 9 that shows this signaling, used in MIPI D-PHY spec. Alternatively, the additional method of communication may not be operational instantaneously, but relatively fast compared to the first-mentioned method of operation. Fast availability can, for example, be achieved with Manchester coding or pulse-width modulated coding. The latter can for instance be realized with a 1-symbol consisting of 2 high periods followed by a low-period, and with a 0-symbol that consists of 1 high period followed by low periods. This delivers a data stream that has a falling edge every 3 periods. The rising edge position is modulated. This can be easily recovered with a clocked-comparator and integrator with reset. Of course, all polarities can be swapped as an alternative with results in a similar solution.

In general, as long as this additional method of communication can become operational after power down much faster than the first-mentioned method of communication, this additional method of communication can be used to exploit the start-up time gap, of the first-mentioned method of communication, for transmission using the additional method, while simultaneously training for the link for switching over to the first-mentioned method later on.

Figure 10:
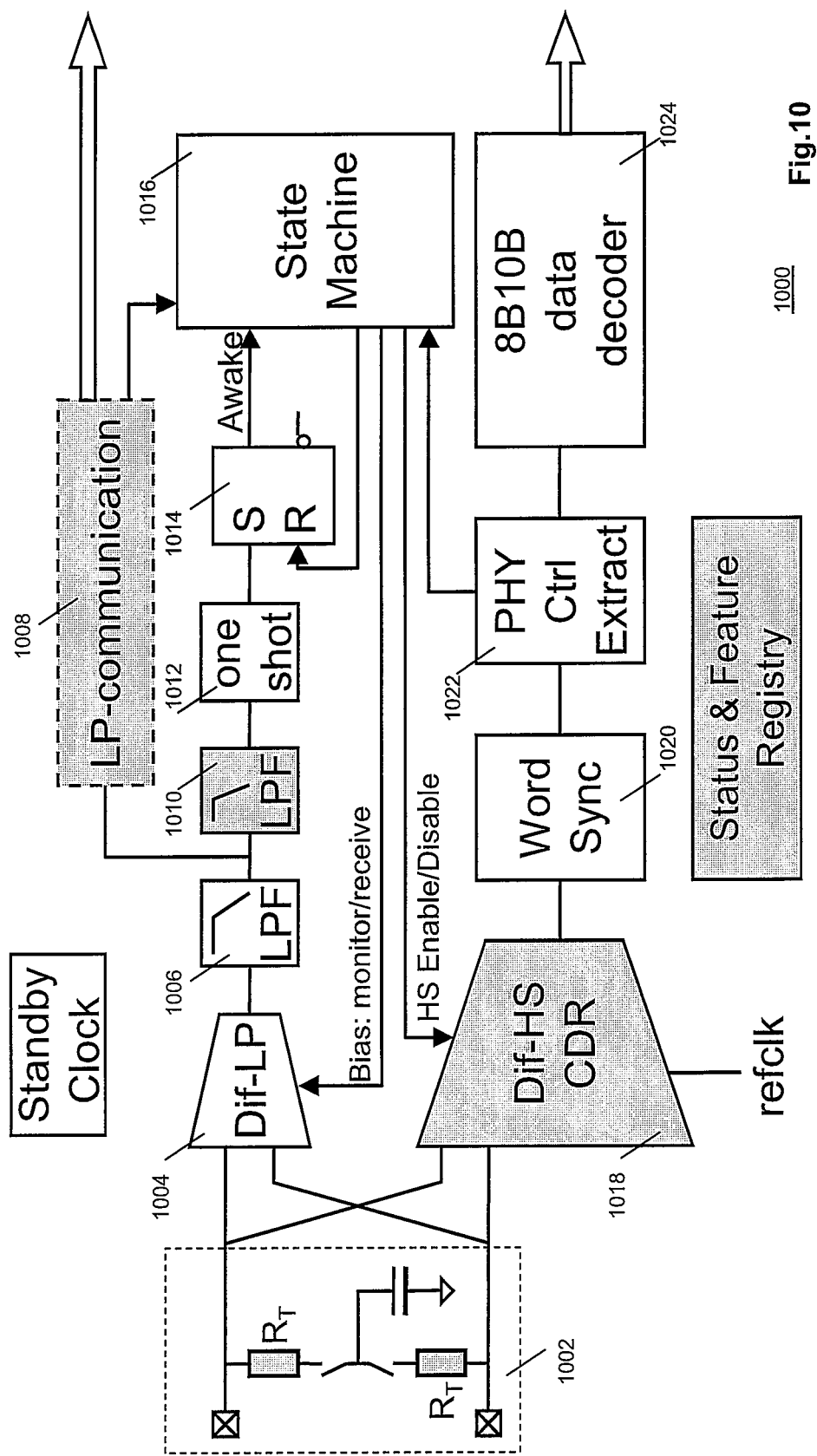

The additional method of communication can, for example, be un-terminated CMOS signaling or low-swing differential un-terminated signaling. It is especially beneficial if a smooth and fast transitioning from one communication method to the other is possible. This is possible if the line states remain well-defined for both methods at any moment in time. For example, differential signaling at the same common-mode level with and without far-end line termination complies with this requirement. FIG. 10 is a block diagram of a receiver 1000 configured for such a dual differential mode operation (terminated and non-terminated. Receiver 1000 has a line termination module 1002 that can selectively be switched on or off. In a low-power (LP) start-up mode, the data communication is routed to a LP differential amplifier 1004 whose output signal is supplied to a low-pass filter 1006. The output of filter 1006 provides the signal for the LP communication processing in a module 1008. The output of filter 1006 is also supplied to a control segment that comprises another low-pass filter 1010, a one-shot circuit 1012, a set-reset flipflop 1014 and a state machine 1016. In the high-speed (HS) mode, the data communication is routed from module 1002 to a HS differential amplifier 1018 with clock and data recovery functionality. An output of amplifier 1018 is supplied to a word synchronization unit 1020. The output of unit 1020 is connected to an input of a unit 1022 for extracting control data for supply to state machine 1016. Unit 1022 supplies the data to an 8B10B decoder 1024.

State machine 1016 receives control inputs from module 1008, flipflop 1014, and from unit 1022. State machine 1016 has control outputs connected to set-reset flipflop 1014, to amplifier 1004 for control of its bias, and to amplifier 1018 for enabling or disabling the latter.

Figure 11:
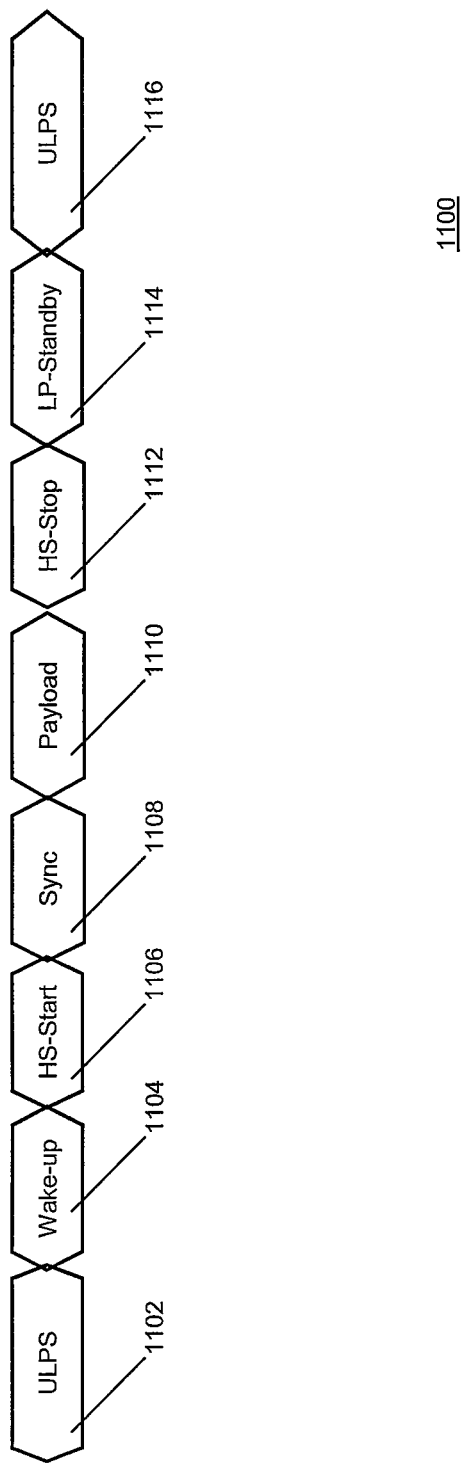

FIG. 11 is a diagram 1100 of the process flow in the dual differential mode operation of receiver 1000. The process relates to differential signaling only, with a same common mode level for both amplifiers 1004 and 1018. The LP signaling mode uses a 0.4V source terminated, far-end open configuration. The HS signaling mode uses a 0.2 source terminated and far-end terminated configuration (DC power). This enables glitch-free mode switching with continuously sufficiently well-determined line states. The filtering in low-pass filter 1010 prevents false wake-up alarms. In a step 1102, referred to as ULPS (ultra-low power state), the LP circuitry is standing-by with a very low current, e.g., a few μA. All other circuitry is shut down. In a step 1104, receiver 1000 is waking up from the ULPS state which is allowed to take up some time. The LP components are active while the HS components are being started in a step 1106, and the clock-circuits are getting synchronized in a step 1108. In a step 1110, the HS data communication is operational to process the data payload. In a step 11012 the HS processing is stopped, and the LP components are kept stand-by before entering the ULPS state in a step 1116.

The invention claimed is:

1. A data communication system comprising:
a transmitter including a first clock-generation circuit; and
a receiver including a second clock-generation circuit, the receiver connected to the transmitter by a communication channel;
wherein:
at least a specific one of the first and second clock-generation circuits is powered-down between consecutive data bursts in a data communication;
the data communication system is configured to expedite starting up operational use of the data communication system upon the power-down of the specific clock-generation circuit;
the data communication system comprising, within at least one of the transmitter and the receiver, a preset block having at least one register to store a digital value, the digital value being used to preset an operational quantity of the specific clock-generation circuit at the starting up;
wherein the preset block is configured to use a previously obtained digital value that is representative of the operational quantity during a previous one of the data bursts, as the digital value for use in a next one of the data bursts.

2. The system of claim 1, wherein the operational quantity is an analog quantity.

3. The system of claim 1, wherein the operational quantity is a digital quantity.

4. The system of claim 1, wherein the specific clock-generation circuit comprises a phase-frequency detector.

5. The system of claim 1, wherein the transmitter is configured to begin communicating data to the receiver before an attribute of a clock signal in the first clock-generation circuit has settled, and wherein the receiver is configured to track the data received while the attribute is settling.

6. The system of claim 5, wherein the attribute is a clock frequency.

7. The system of claim 5, wherein the attribute is a clock phase.

8. The system of claim 5, wherein:
the data communication system has an operational mode for communication of the data in the operational use of the data communication system, and a configuration mode for configuring the data communication system for the operational use;
in the configuration mode, the transmitter communicates to the receiver, information about the attribute; and
the data communication system configures the receiver so as to enable the data communication before the attribute has settled.

* * * * *